United States Patent
Ladd et al.

(10) Patent No.: US 7,704,782 B2
(45) Date of Patent: Apr. 27, 2010

(54) METHOD OF FORMING PIXEL CELLS WITH COLOR SPECIFIC CHARACTERISTICS

(75) Inventors: John Ladd, Boise, ID (US); Inna Patrick, Boise, ID (US); Gennadiy A. Agranov, Boise, ID (US); Jeff A. McKee, Meridian, ID (US)

(73) Assignee: Aptina Imaging Corporation, Grand Cayman (KY)

( * ) Notice: Subject to any disclaimer, the term of this patent is extended or adjusted under 35 U.S.C. 154(b) by 1074 days.

(21) Appl. No.: 11/213,938

(22) Filed: Aug. 30, 2005

(65) Prior Publication Data

US 2007/0045680 A1 Mar. 1, 2007

(51) Int. Cl.
*H01L 21/00* (2006.01)

(52) U.S. Cl. .................. 438/73; 257/292; 257/E21.352

(58) Field of Classification Search .................. 438/73; 257/292, E21.352
See application file for complete search history.

(56) References Cited

U.S. PATENT DOCUMENTS

| | | | |
|---|---|---|---|
| 5,965,875 A | 10/1999 | Merrill | |
| 6,150,683 A * | 11/2000 | Merrill et al. | 257/292 |
| 6,518,085 B1 * | 2/2003 | Wang et al. | 438/70 |
| 6,548,833 B1 * | 4/2003 | Lin et al. | 257/89 |
| 6,740,905 B1 * | 5/2004 | Kaya et al. | 257/89 |
| 6,756,616 B2 * | 6/2004 | Rhodes | 257/291 |
| 6,756,618 B2 * | 6/2004 | Hong | 257/292 |
| 6,870,149 B2 | 3/2005 | Berezin | |
| 7,262,404 B2 * | 8/2007 | Yamaguchi et al. | 250/226 |
| 7,345,703 B2 * | 3/2008 | Lee | 348/272 |
| 2003/0042509 A1 * | 3/2003 | Rhodes | 257/222 |
| 2004/0161868 A1 | 8/2004 | Hong | |
| 2006/0043519 A1 * | 3/2006 | Ezaki | 257/461 |

* cited by examiner

*Primary Examiner*—Steven J Fulk
(74) *Attorney, Agent, or Firm*—Dickstein Shapiro LLP

(57) ABSTRACT

Imager devices having an array of photosensors, each photosensor having at least two doped regions. The two doped regions are each independently tailored to a particular wavelength.

13 Claims, 7 Drawing Sheets

METHOD OF FORMING PIXEL CELLS WITH COLOR SPECIFIC CHARACTERISTICS

FIELD OF THE INVENTION

The present invention relates to the field of semiconductor devices and, in particular, to imager devices having an array of photosensors, each photosensor having at least two doped regions. The two doped regions are each independently tailored to a particular wavelength.

BACKGROUND OF THE INVENTION

Imagers typically consist of an array of pixel cells containing photosensors, where each pixel cell produces a signal corresponding to the intensity of light impinging on that pixel cell when an image is focused on the array. These signals may then be stored, for example, to display a corresponding image on a monitor or otherwise used to provide information about the optical image. The photosensors are typically phototransistors, photoconductors, photogates or photodiodes. The magnitude of the signal produced by each pixel cell, therefore, is proportional to the amount of light impinging on the photosensor.

To allow the photosensors to capture a color image, the photosensors must be able to separately detect photons of wavelengths of light associated with at least first, second, and third colors, e.g., red (R), green (G), and blue (B) photons. Accordingly, each pixel cell must be sensitive only to one color or spectral band. For this, a color filter array is typically placed between the image being captured and the pixel cells so that each pixel cell measures the light of the color of its associated filter.

Color imaging typically requires three pixel cells (R, G, B) for the formation of a single color pixel cell. For example, a conventional color pixel cell array 50 is illustrated in FIG. 1 in a linear layout, for convenience, as including a red active pixel cell 52, a green active pixel cell 54, and a blue active pixel cell 56, spaced apart on a semiconductor substrate 16 by isolation regions 19. Each of the red, green, and blue active pixel cells 52, 54, 56 have respective red, green, and blue filters 17R, 17G, 17B, which are part of color filter array 117, which allow only red, green, and blue photons, respectively, to pass through. In practice, the color pixel cells are typically arranged in a Bayer pattern in rows and columns, with one row of alternating green and blue pixel cells, and another row alternating red and green pixel cells.

A brief description of the structural and functional elements of each of the red, green, and blue active pixel cells 52, 54, 56 is now provided. Each of the pixel cells 52, 54, 56 is shown in part as a cross-sectional view of a semiconductor substrate 16, which may be a p-type silicon epitaxial layer 16 provided over a p-type substrate 51 and having a well of p-type material 20. An n+ type region 26 is formed as part of a photodiode photosensor with a p-type layer 53 above it, and laterally displaced from p-well 20. In operation, photons striking the surface of the p-type layer 53 generate electrons that are collected in the n+ type region 26. A transfer gate 28 is formed between the n+ type region 26 and a second n+ type region 30 formed in p-well 20, which, when activated, transfers the photon-generated charge from the n+ type region 26 to the n+ type region 30, typically referred to as a floating diffusion region. The n+ type regions 26, 30 and transfer gate 28 form a charge transfer transistor 29 which is controlled by a transfer signal TX (not shown). The floating diffusion region 30 passes the photon-generated charge accumulated thereat to the gate of a source follower transistor 36.

A reset gate 32 is also formed adjacent and between floating diffusion region 30 and another n+ type region 34 (also formed in p-well 20). The reset gate 32, floating diffusion region 30, and n+ type region 34 form a reset transistor 31, which is controlled by a reset signal RST (not shown). The n+ type region 34 is coupled to voltage source $V_{aa\text{-}pix}$ (not shown) The transfer and reset transistors 29, 31 are n-channel transistors as described in this implementation of a CMOS imager circuit.

Each pixel cell 52, 54, 56 also includes two additional n-channel transistors, a source follower transistor 36 and a row select transistor 38 (shown electrically, not in cross section). Transistors 36, 38 are coupled in series, source to drain, with the source of transistor 36 also coupled to voltage source $V_{aa\text{-}pix}$ (not shown) and the drain of transistor 38 coupled to a column line 39. The drain of the row select transistor 38 is connected via a conductor to the drains of similar row select transistors for other pixels in a given pixel column. Thus, the red, green, and blue pixel cells 52, 54, 56 operate in a similar way, except that the information provided by each pixel cell 52, 54, 56 is limited by the intensities of red, green, and blue light, respectively.

One of the drawbacks of using a conventional color pixel, such as the color pixel cell array 50, is that the wavelength range corresponding to the color blue is not fully captured. This is a result of the fact that the wavelengths of light corresponding to blue light are lower than wavelengths of light for both green and red in the natural environment. Cross talk is another drawback of conventional imagers. Cross talk relates to the amount of response a pixel cell (e.g., pixel cells 52, 54, 56) exhibits for a particular wavelength of light other than the wavelength of light which it is intended to capture.

Accordingly, a pixel cell for use in an imager that exhibits improved color separation and reduced cross talk is needed. A method of fabricating a pixel cell exhibiting these improvements is also needed.

SUMMARY OF THE INVENTION

An exemplary embodiment of the present invention provides an imager having at least first and second photosensors formed within a substrate, each photosensor having a first doped region of a first conductivity type formed over a second doped region of a second conductivity type, wherein said first and second conductivity types are different from each other and one of said second doped regions of said first and second photosensors has different implant dose than the other of said second doped region of said first and second photosensors.

A second exemplary embodiment of the present invention provides an imager having at least first and second photosensors formed within a substrate, each photosensor having a first doped region of a first conductivity type formed over a second doped region of a second conductivity type, wherein said first and second conductivity types are different from each other, and one of said first doped regions of said first and second photosensors has a different depth within said substrate than the other of said first doped regions of said first and second photosensors.

BRIEF DESCRIPTION OF THE DRAWINGS

The above-described features and advantages of the invention will be more clearly understood from the following detailed description, which is provided with reference to the accompanying drawings in which.

DETAILED DESCRIPTION OF THE PREFERRED EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in or over the base semiconductor structure or foundation. In addition, the semiconductor need not be silicon-based, but could be based on silicon-germanium, silicon-on-insulator, silicon-on-sapphire, germanium, or gallium arsenide, or other semiconductor materials.

The term "pixel" or "pixel cell" refers to a picture element unit cell containing a photosensor and transistors for converting electromagnetic radiation to an electrical signal. For purposes of illustration, portions of representative pixels are illustrated in the figures and description herein and, typically, fabrication of all imager pixels in an imager array will proceed simultaneously in a similar fashion.

Figure 2:
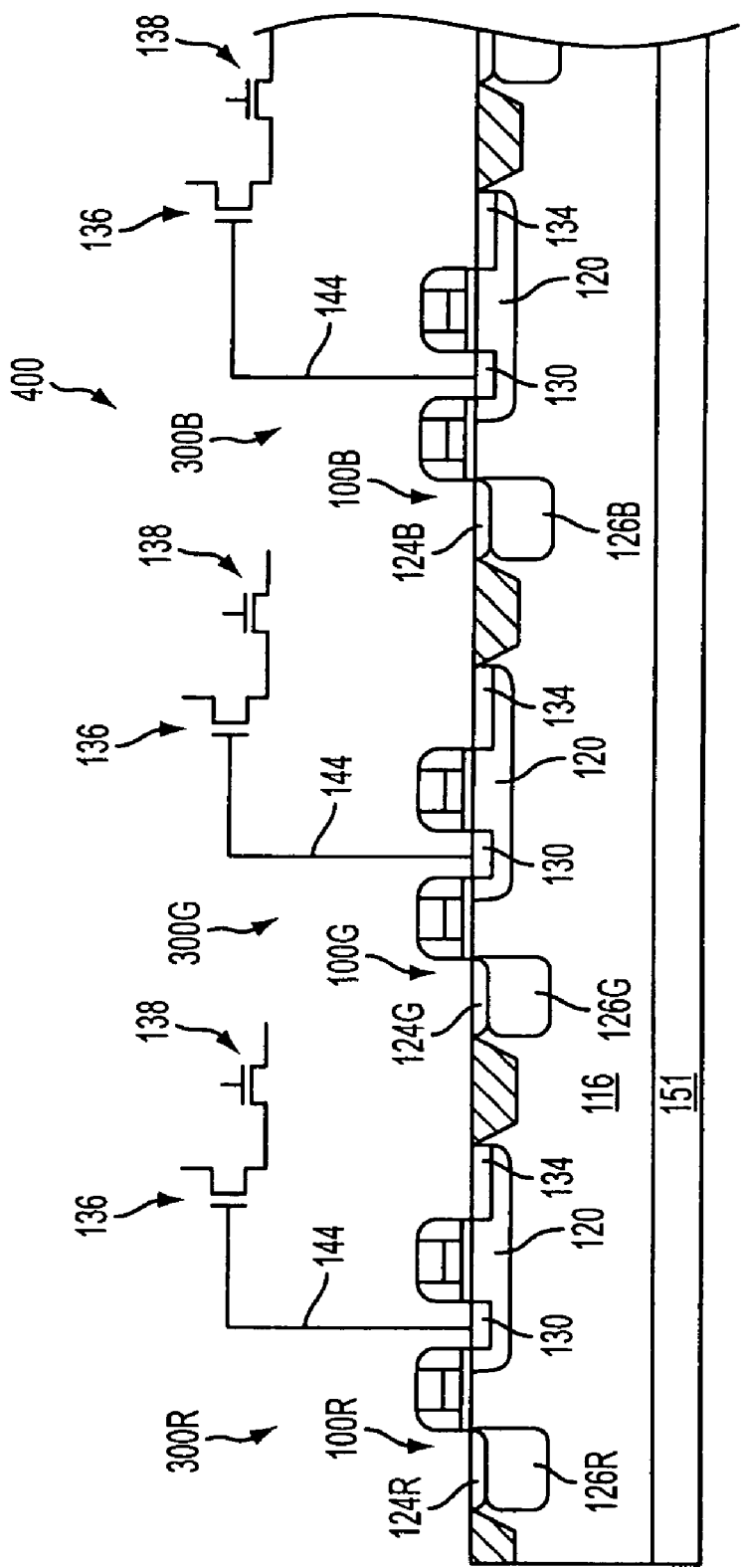
FIG. 2 illustrates a partial cross-sectional view of a pixel cell array constructed in accordance with an exemplary embodiment of the invention.

Referring now to the drawings, where like elements are designated by like reference numerals, FIG. 2 illustrates an exemplary embodiment of a pixel cell array 400 formed in accordance with an exemplary embodiment of the invention. The pixel cell array 400 includes first, second, and third pixel cells 300R, 300G, 300B, each having respective first, second, and third photosensors 100R, 100G, 100B. The first, second, and third photosensors 100R, 100G, 100B have a first relative configuration wherein each photosensor is optimized to receive photons from first, second, and third wavelengths of light, e.g., red, green, and blue photons, as discussed further below.

The first, second, and third photosensors 100R, 100G, 100B are formed in association with a semiconductor substrate 116, which may be a p-type silicon epitaxial layer provided over a p-type substrate 151. The semiconductor substrate 116 has wells of p-type material 120. The first, second, and third photosensors 100R, 100G, 100B each have corresponding first doped regions 124R, 124G, 124B and second doped regions 126R, 126G, 126B. The first doped regions 124R, 124G, 124B are formed of a material having a first conductivity type, and the second doped regions 126R, 126G, 126B are formed of a material having a second conductivity type. The illustrated first and second doped regions 124R, 124G, 124B, 126R, 126G, 126B have first and second conductivity types that are different from each other; for example, the first conductivity type could be p-type and the second conductivity type could be n-type.

The first, second and third photosensors 100R, 100G, 100B that are each tailored to a first, second, and third set of wavelengths, e.g., red, green, and blue photons. This occurs by varying the dopant implant dose of at least two of the second doped regions 126R, 126G, 126B. For example, the second doped region 126B of the third photosensor 100B can be doped to have an dopant concentration less than either or both of the second doped regions 126R, 126G of the first and second photosensors 100R, 100G.

The dopant concentration of either or both the second doped regions 126R, 126G of the first and second photosensors 100R, 100G could be in the range from about $1 \times 10^{12}/cm^3$ to about $1 \times 10^{13}/cm^3$. The illustrated second doped region 126R of the first photosensor 100R has a dopant concentration of about $2 \times 10^{12}/cm^3$ to about $5 \times 10^{12}/cm^3$. The second doped region 126B of the third photosensor 100B, on the other hand, could have a lower dopant concentration than the other second doped regions 126R, 126G. For example, the dopant concentration of the second doped region 126B of the third photosensor 100B could be in the range from about $5 \times 10^{11}/cm^3$ to about $6 \times 10^{12}/cm^3$. The illustrated second doped region 126B of the third photosensor 100B has a dopant concentration in the range from about $1 \times 10^{12}/cm^3$ to about $4 \times 10^{12}/cm^3$.

Conventional pixel cell arrays (e.g., pixel cell array 50 of FIG. 1) have second doped regions with dopant concentrations that are substantially the same among all of the pixel cells. As a result, all of the photosensors of conventional pixel cell arrays (e.g., pixel cell arrays 50 of FIG. 1) have the same saturation point, i.e., the maximum number of electrons that can be held within the second doped regions (e.g., second doped regions 26 of FIG. 1) prior to charge transference. Once the saturation point has been achieved, the second doped regions of conventional photosensors (e.g., photosensor 52 of FIG. 1) can no longer hold any electrons; the excess electrons scatter throughout the epitaxial substrate layer (e.g., semiconductor substrate 16), which leads to electrical cross talk.

As discussed above with respect to FIG. 1, photons at the wavelengths of light associated with the color blue are typically not as abundant as photons at the wavelengths of light associated with the colors red and green in ambient light. As a result, photosensors intended to capture red and green light will reach saturation relatively quicker than photosensors intended to capture blue light. Conventional imagers, therefore, limit the exposure of the light striking the surface of the photosensors based primarily on the saturation points of red and green photosensors. The blue photosensors are not exposed to light long enough for the photosensor to fully compensate for signal-to-noise ratios; i.e., insufficient signals to compensate for the noise associated with the transference and processing of the signal. Accordingly, wavelengths of light associated with the color blue are not well captured by conventional photosensors.

The FIG. 2 pixel cell array, on the other hand, has improved blue light response as a result of the relative increase in the saturation point of the first and second photosensors 100R, 100G compared to the saturation point of the third photosensor 100B. The relative saturation points of both the first and second photosensors 100R, 100G are raised by lowering the dopant concentration of the second doped region 126B of the third photosensor 100B. Accordingly, the pixel cell array 400 can be exposed to light emitted from an image to be captured for an extended amount of time, without the first and second photosensors 100R, 100G reaching saturation. The longer exposure allows the stronger signal strength particularly for the blue photosensor that can compensate for noise that is typically associated with the processing of the signal.

The stronger signal strength output by the third photosensor 100B may allow for a lower amplification of the signal as the signal is processed. Typical pixel cell arrays (e.g., the pixel cell array 50 of FIG. 1) amplify signals output by red, green, and blue pixel cells (e.g., the pixel cells 52, 54, 56 of FIG. 1) at various levels based on the signal strength of the signal being amplified. For example, the signal associated with the capture of wavelengths of light associated with the color red would be amplified at a first level, whereas the signal associated with the capture of wavelengths of light associated with the color blue would be amplified at a second level. Due to the abundance of wavelengths of light associated with the color red, the amplification of the signal associated with its capture would be relatively low (as compared to the amplification of signals associated with the capture of wavelengths of light associated with the colors green and blue). On the other hand, the amplification of the signals associated with the capture of wavelengths of light associated with the color blue would be amplified at a relatively high level (as compared to the amplification of signals associated with the capture of wavelengths of light associated with the colors red and green) due to the scarcity of wavelengths of light associated with the color blue.

Figure 1:
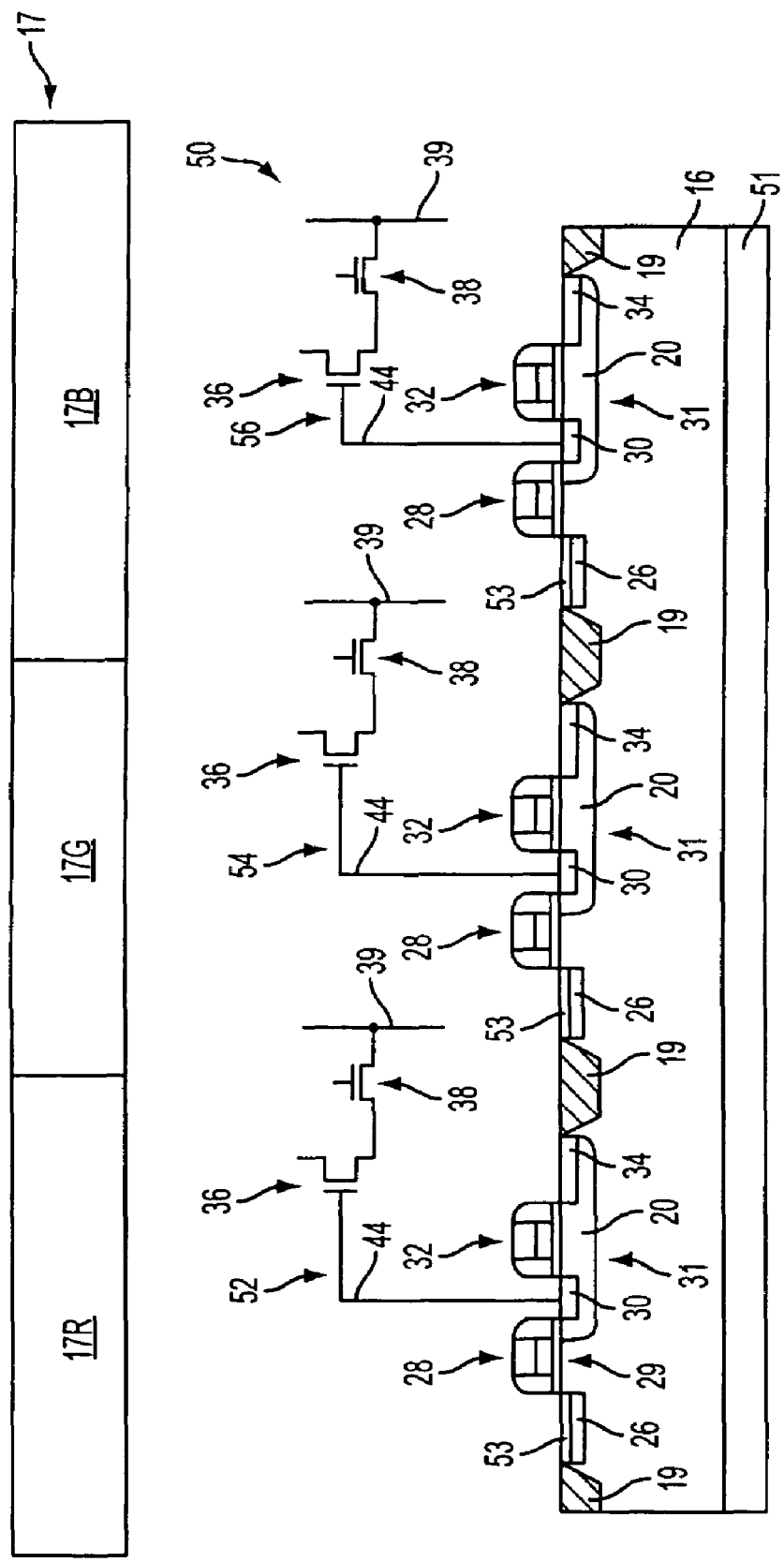
FIG. 1 illustrates a partial cross-sectional view of a conventional pixel cell array.

The high level of amplification of the signals associated with the capture of wavelengths of light associated with the color blue also results in the amplification of noise associated with the operation of typical pixel cells (e.g., pixel cell 56 of FIG. 1). For example, due to the higher level of amplification, the noise associated with the operation of typical pixel cells, such as dark current, discussed in greater detail below with respect to FIG. 6, may be amplified.

The FIG. 2 pixel cell array 400, on the other hand, may reduce the amplification of noise, such as dark current, by lowering the amplification of the signals associated with the capture of wavelengths of light associated with the color blue; due to the higher signal strength, as discussed above, the signal output by the third photosensor 100B may not need as high a level of amplification as typical pixel cells processing wavelengths of light associated with the color blue would.

Although illustrated as four-transistor (4T) color pixel cells 300R, 300G, 300B, FIG. 2 is not limiting in any way. For example, the color pixel cells 300R, 300G, 300B could have fewer or more than 4 transistors, as is known in the art. The invention also has application to other solid state photosensor arrays and is not limited to CMOS photosensor arrays. Further, although the invention is described with reference to red, green, and blue photosensors, the invention is not limited to this combination of photosensor colors and it can be used with YCMK color pixel arrays, and others as well.

Figure 3:
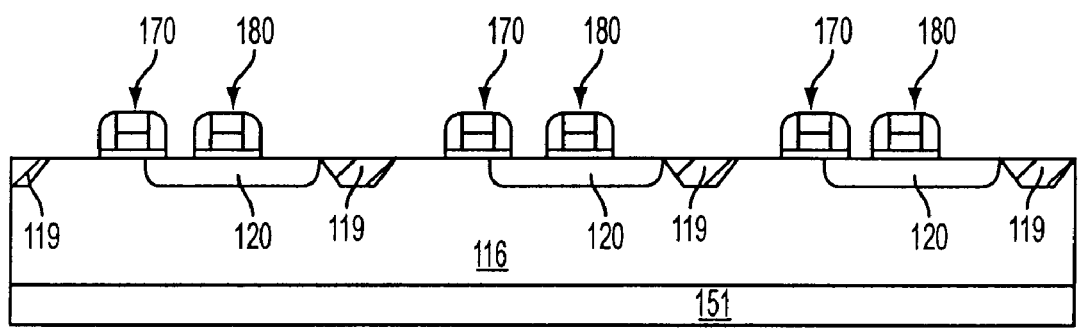
FIGS. 3-5 illustrate partial cross-sectional views of an exemplary method of fabricating the FIG. 2 pixel cell array.

FIG. 3-6 illustrate an exemplary method of fabricating the FIG. 2 pixel cell array 400. FIG. 3 illustrates the substrate 151 having an epitaxial layer 116. If a p+ epitaxial substrate layer is desired, a p-type epitaxial layer 116 is formed over a highly doped P+ substrate 151, as illustrated in FIG. 3. The p-type epitaxial layer 116 may be formed to a thickness of about 2 microns to about 12 microns, more preferably of about 3 microns to about 7 microns, most preferably of about 3 microns. The p-type epitaxial layer 116 may have a dopant concentration in the range of about $1\times10^{14}$ to about $5\times10^{16}$ atoms per $cm^3$, more preferably of about $5\times10^{14}$ to about $5\times10^{15}$ atoms per $cm^3$.

FIG. 3 also illustrates conventional field oxide regions 119, often referred to as trench isolation regions, formed in the p-type epitaxial layer 116. The field oxide regions 119 are formed using a conventional STI process and are typically formed by etching a trench in the substrate via a directional etching process, such as Reactive Ion Etching (RIE), or etching with a preferential anisotropic etchant used to etch into the substrate.

The trenches are then filled with an insulating material, for example, silicon dioxide, silicon nitride, ON (oxide-nitride), NO (nitride-oxide), or ONO (oxide-nitride-oxide). The insulating materials may be formed by various chemical vapor deposition (CVD) techniques such as low pressure chemical vapor deposition (LPCVD), high density plasma (HDP) deposition, or any other suitable method for depositing an insulating material within a trench. After the trenches are filled with an insulating material, a planarizing process such as chemical mechanical polishing is used to planarize the structure.

Multi-layered transfer gate stacks 170 and reset gate stacks 180, each corresponding to exemplary four-transistor (4T) pixel cells, are formed over the p-type epitaxial layer 116 after the STI trenches are formed and filled. FIG. 3 further illustrates an optional p-type implanted well 120 located below the gate stacks 170, 180. The p-type implanted well 120 may be formed by dopant implantation before or after the formation of the gate stacks 170, 180.

Figure 4:
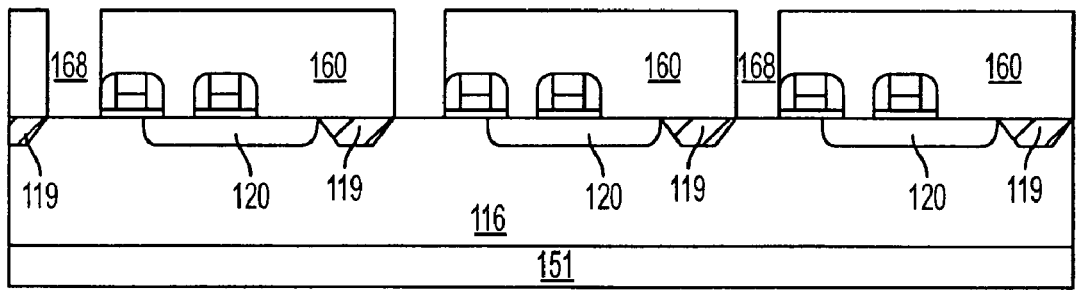
Figure 5:
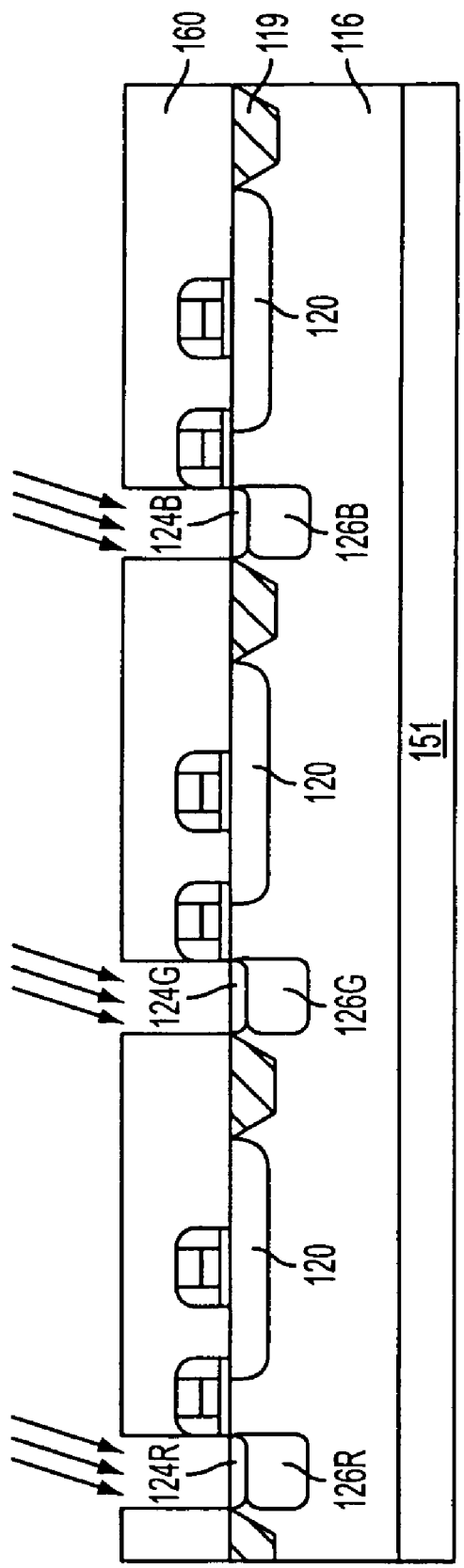

FIG. 4 illustrates a photoresist layer 160 formed over the FIG. 3 structure to a thickness in the range from about 1,000 Angstroms to about 50,000 Angstroms. The photoresist layer 160 is patterned to obtain openings 168 over the p-type epitaxial layer 116 where elements of the photosensors (e.g., 100R, 100G, 100B of FIG. 2) will be formed. According to an exemplary embodiment of the invention, each photosensor 100R, 100G, 100B (FIG. 2) is a p-n-p photosensor formed by first doped regions 124R, 124G, 124B, second doped regions 126R, 126G, 126B, and p-type epitaxial layer 116. The second doped regions 126R, 126G, 126B are formed by implanting dopants of a second conductivity type, which for exemplary purposes is n-type, in the exposed areas of the semiconductor substrate 116, as illustrated in FIG. 5.

The implanted second doped regions 126R, 126G, 126B form a photosensitive charge storage region for collecting photogenerated electrons. Ion implantation may be conducted by placing the substrate 151 in an ion implanter, and implanting appropriate dopant ions into the semiconductor substrate 116 to form the second doped regions 126R, 126G, 126B. The first and second photosensors 100R, 100G can be further doped to a higher dopant concentration relative to the third photosensor 100B, as discussed above with respect to FIG. 2, by placing a second resist layer (not shown) over the third photosensor 100B only. N-type dopants such as arsenic or phosphorous may be employed for second doped regions 126R, 126G, 126B at an energy of 20 KeV to 1 MeV. If desired, multiple implants may be used to tailor the profile of the second doped regions 126R, 126G, 126B. The implants forming the second doped regions 126R, 126G, 126B may also be angled implants, formed by angling the direction of implants toward the gate stacks 170, 180.

Another dopant implantation with a dopant of a first conductivity type, which for exemplary purposes is p-type, is subsequently conducted so that p-type ions are implanted into the areas of the substrate over the implanted second doped regions 126R, 126G, 126B to form the first doped regions 124R, 124G, 124B of the now completed first, second, and third photosensors 100R, 100G, 100B (FIG. 2). The first doped regions 124R, 124G, 124B may be a P+ or a P− implanted region formed by conducting a dopant implantation to implant p-type ions, such as boron or indium, into area of the p-type epitaxial layer 116. The ion implantation may be conducted at an energy of 50 KeV to about 5 MeV, more preferably of about 100 KeV to about 1 MeV.

Figure 6:
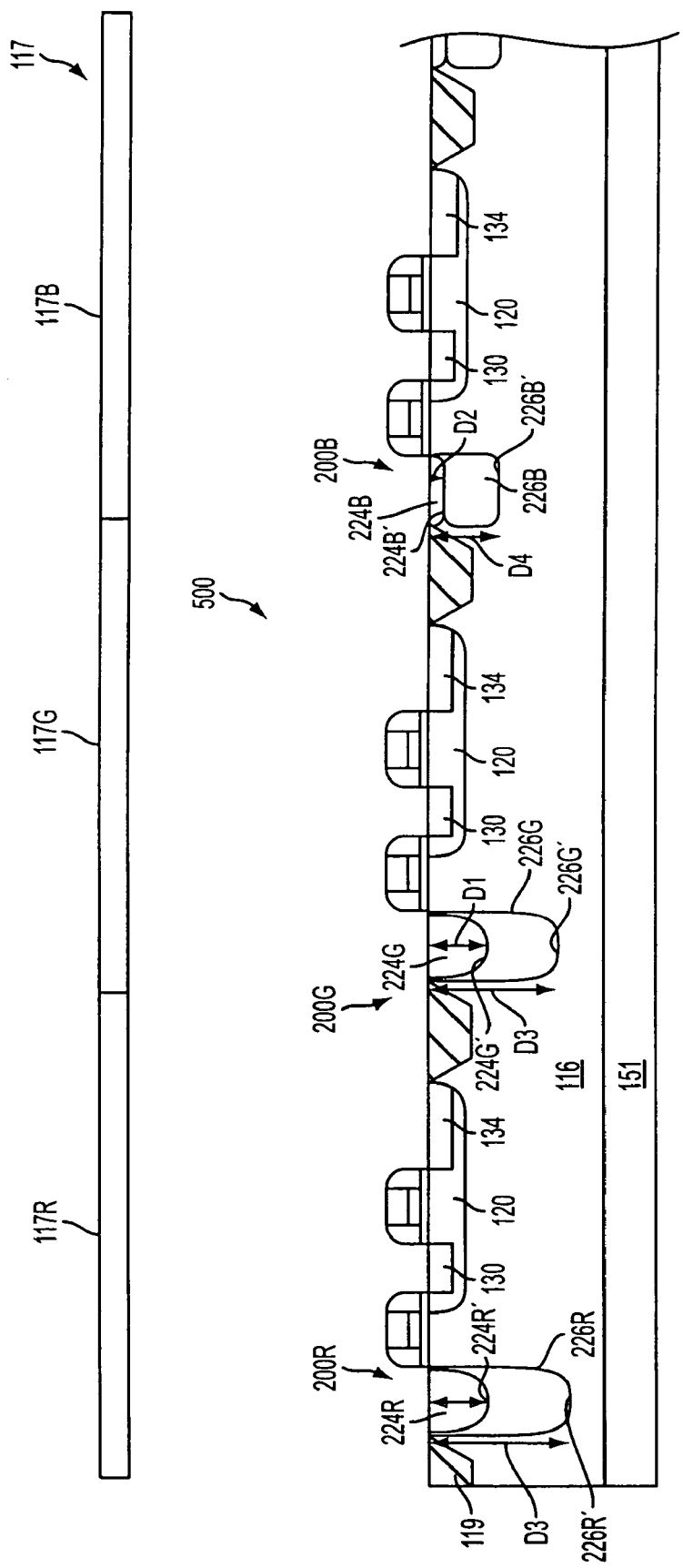
FIG. 6 illustrates a partial cross-sectional view of a pixel cell array constructed in accordance with a second exemplary embodiment of the invention.

FIG. 6 illustrates a pixel cell array 500 constructed in accordance with a second exemplary embodiment of the invention. As illustrated in FIG. 6, the pixel cell array 500 includes first, second, and third photosensors 200R, 200G, 200B that have a second configuration relative to one another. Like the FIG. 2 pixel cell array 400, each of the first, second, and third photosensors 200R, 200G, 200B has a first doped region 224R, 224G, 224B and a second doped region 226R, 226G, 226B. Unlike the FIG. 2 pixel cell array, however, at least two of the first doped regions 224R, 224G, 224B of the first, second, and third photosensors 200R, 200G, 200B have a first depth D1 and a second depth D2 that are different from each other, each tailored to capture a particular range of wavelengths of light corresponding to first, second, and third colors, e.g., red, green, and blue.

The illustrated pixel cell array 500 has first doped regions 224R, 224G of the first and second photosensors 200R, 200G having a first depth D1 from a surface of the epitaxial substrate 116 to bottom portions 224R', 224G' of the first doped regions 224R, 224G, and the first doped region 224B of the third photosensor 200B having a second depth D2 from a surface of the epitaxial substrate 116 to a bottom portion 224B' of the first doped regions 224B, wherein the first and second depths D1, D2 are different from each other. For example, the first depth D1 could be in the range from about 0.4 μm to about 0.7 μm from a surface of the epitaxial substrate 116 to a bottom portion of the first doped region. The second depth D2 could be in the range from about 0.05 μm to about 0.15 μm from a surface of the epitaxial substrate 116 to a bottom portion of the first doped region. The first and second depths D1, D2 could be achieved by varying the implant energy, as discussed above with respect to FIG. 5. For example, the first doped regions 224R, 224G of first and second photosensors 200R, 200G could be formed by implanting dopant ions at a first energy level, and the first doped region 224B of the third photosensor 200B could be formed by implanting dopant ions at a second energy level.

The first energy level could be in the range from about 5 KeV to about 750 KeV, and the second energy level could be in a range of less than 750 KeV. The illustrated first doped regions 224R, 224G of the first and second photosensors 200R, 200G are formed by using an implant energy level in the range from about 30-150 KeV to achieve the desired first depth D1. The first doped region 224B of the third photosensor 200B is formed by using an implant energy level in the range of less than 30 KeV to achieve the desired second depth D2.

The first, second, and third photosensors 200R, 200G, 200B each have second doped regions 226R, 226G, 226B. The second doped regions could optionally be tailored to capture wavelengths of light corresponding to first, second, and third colors, e.g., red, green, and blue. As illustrated, the second doped regions 226R, 226G of the first and second photosensors 200R, 200G have a third depth D3 in the range from about 0.9 μm to about 1.2 μm from a surface of the epitaxial substrate 116 to bottom portions 226R', 226G' of the second doped regions 226R, 226G. The second doped region 226B of the third photosensor 200B is illustrated as having a fourth depth D4 in the range from about 0.6 μm from a surface of the epitaxial substrate 116 to a bottom portion 226B' of the second doped region 226B.

It should be noted that varying the implant depth of the second doped regions 226R, 226G, 226B is only optional, and is not intended to be limiting in any way. For example, the second doped regions 226R, 226G, 226B of the first, second, and third photosensors 200R, 200G, 200B could all be formed having substantially similar depths from a surface of the epitaxial substrate 116 to a bottom portion of the second doped region.

One of the advantages of tailoring the depth of the first doped regions 224R, 224G, 224B relates to the depth at which different wavelengths of light are absorbed within the epitaxial substrate 116. Conventional photosensors typically have first, second, and third photosensors that all have first doped regions all formed at a substantially similar depth. As a result, the photosensors intended to respond to red and green only, invariably respond to blue as well. The cross talk in conventional pixel cell arrays results in a loss of image quality.

On the other hand, the FIG. 6 pixel cell array 500 has at least two of the first doped regions 224R, 224G, 224B of the first, second, and third photosensors 200R, 200G, 200B having first and second depths D1, D2 that are different from each other. The wavelengths of light corresponding to the color blue typically do not penetrate the first doped region of a photosensor past a depth of about 0.15 μm; by creating first doped regions 224R, 224G of the first and second photosensors 200R, 200G at a first depth D1 lower than 0.15 μm, the first and second photosensors 200R, 200G may suppress the signal response for wavelengths of light corresponding to the color blue. The first doped region 224B of the third photosensor 200B, on the other hand, is tailored such that it captures wavelengths of light corresponding to the color blue, and may have an increased response as well.

The FIG. 6 pixel cell array 500 may also reduce dark current (i.e., electrical current in the photosensor in the absence of light). Dark current is often a result of trap sites. Trap sites are areas in the silicon dioxide/silicon interface that can "trap" electrons or holes. For example, dangling bonds or broken bonds along the silicon dioxide/silicon interface can trap electrons or holes.

The trap sites are typically uncharged, but become energetic when electrons and holes become trapped therein. Highly energetic electrons or holes are called hot carriers. Hot carriers can get trapped in the available trap sites, and contribute to the fixed charge of the device and change the threshold voltage and other electrical characteristics of the device. The current generation from trap sites inside or near conventional photosensors contributes to dark current in conventional pixel cell arrays since a constant charge is leaking into the photosensor. Dark current is detrimental to the operation and performance of a photosensor, and often leads to poor image quality.

The FIG. 6 pixel cell array, on the other hand, may reduce the incidence of dark current by forming first doped regions 224R, 224G of the first and second photosensors 200R, 200G at a first depth further away from the silicon dioxide/silicon interface (typically between the field oxide region 119 and the photosensor 200R) when compared to conventional pixel cell arrays (e.g., pixel cell array 50 of FIG. 1).

Yet another advantage of the FIG. 6 pixel cell array 500 is the possibility of reducing the thickness of the color filter array 117. Because the first doped regions 224R, 224G, 224B of the first, second, and third photosensors 200R, 200G, 200B are formed at first and second depths D1, D2, and the incidence of cross talk is decreased, the thickness of the color filter array 117 having first, second, and third color filters 117R, 117G, 117B may be reduced. The reduction of the thickness of the color filter array 117 may prevent the incidence of optical cross talk. Optical cross talk typically occurs as wavelengths of light penetrate materials that exhibit a refractive index, wherein the refractive index directs light onto an adjacent photosensor that the particular wavelength of light is not intended to strike. The incidence of optical cross talk increases as the thickness of a particular material increases; therefore, by reducing the thickness of the color filter array 117 relative to conventional pixel cell arrays (e.g., pixel cell array 50 of FIG. 1), the incidence of optical cross talk may decrease.

Figure 7:
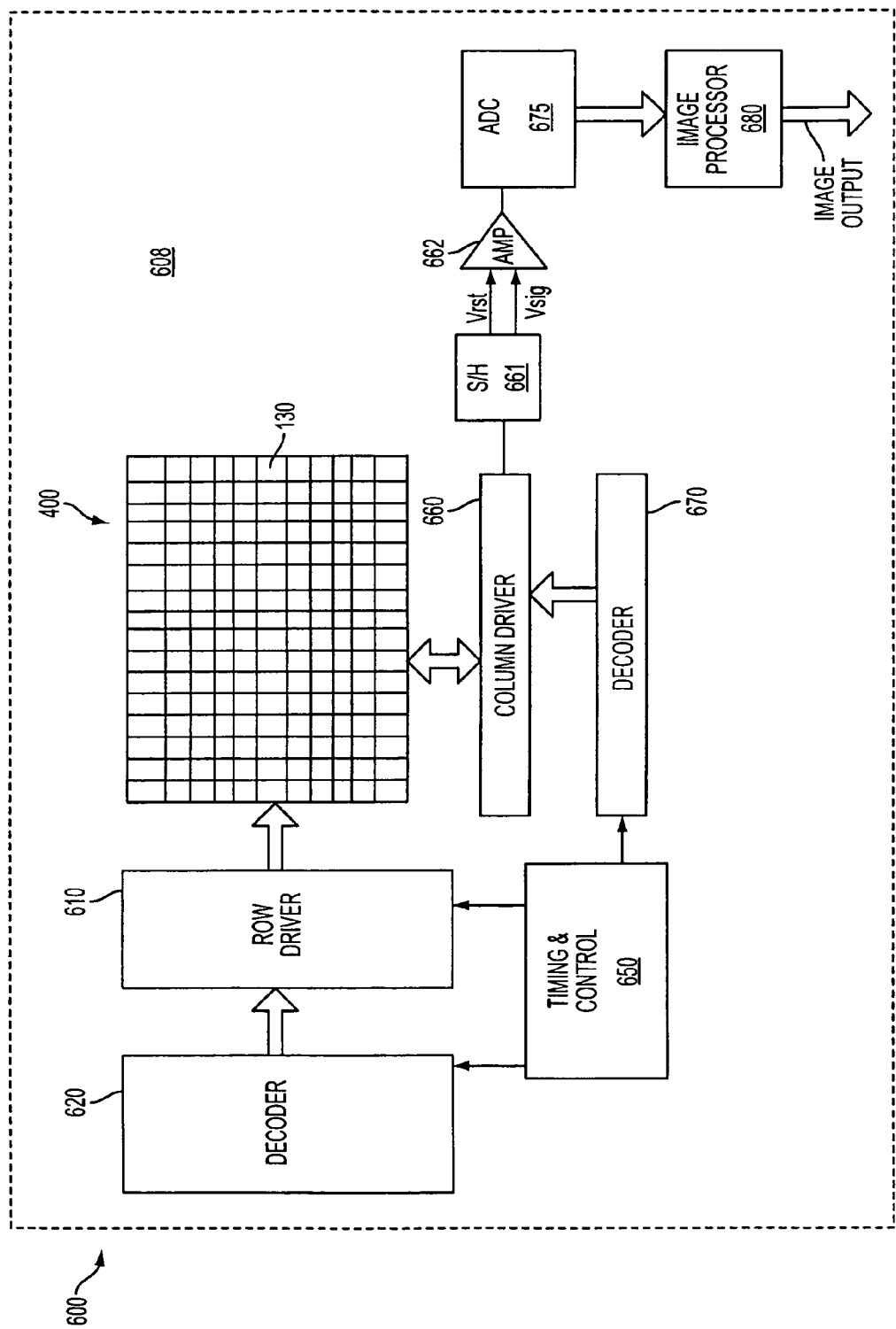
FIG. 7 is a block diagram of an imaging device incorporating the pixel cell array constructed in accordance with FIG. 2.

FIG. 7 illustrates an imaging device 608 incorporating a pixel cell array 400, 500 constructed in accordance with the invention. For the sake of clarity, the imaging device will be described as including the FIG. 2 pixel cell array 400; however, it should be noted that any of the exemplary embodiments described with respect to FIGS. 2-6 could be included.

In operation of the imaging device 608, the pixel cells (e.g., first, second, and third pixel cells 100R, 100G, 100B of FIG. 2) of each row in the cell array 400 are all turned on at the same time by a row select line, and the pixel cells (e.g., first, second, and third pixel cells 100R, 100G, 100B of FIG. 2) of each column are selectively output by respective column select lines. A plurality of row and column lines are provided for the entire pixel cell array 400. The row lines are selectively activated in sequence by the row driver 610 in response to row address decoder 620 and the column select lines are selectively activated in sequence for each row activation by the column driver 660 in response to column address decoder 670. Thus, a row and column address is provided for each pixel cell (e.g., first, second, and third pixel cells 100R, 100G, 100B of FIG. 2). The imaging device 608 is operated by the control circuit 650, which controls address decoders 620, 670 for selecting the appropriate row and column lines for pixel readout, and row and column driver circuitry 610, 660, which apply driving voltage to the drive transistors of the selected row and column lines.

The pixel output signals typically include a pixel reset signal Vrst taken off of the floating diffusion region (via the source follower transistor) when it is reset and a pixel image signal Vsig, which is taken off the floating diffusion region (via the source follower transistor) after charges generated by an image are transferred to it. The Vrst and Vsig signals are read by a sample and hold (S/H) circuit 661 and are subtracted by a differential amplifier (AMP) 662, which produces a difference signal (Vrst−Vsig) for each pixel cell in the array 400, which represents the amount of light impinging on the pixel cell. This signal difference is digitized by an analog-to-digital converter (ADC) 675. The digitized pixel signals are then fed to an image processor 680 to form a digital image output. In addition, as depicted in FIG. 7, the imaging device 608 may be included on a single semiconductor chip (e.g., chip substrate 600).

Figure 8:
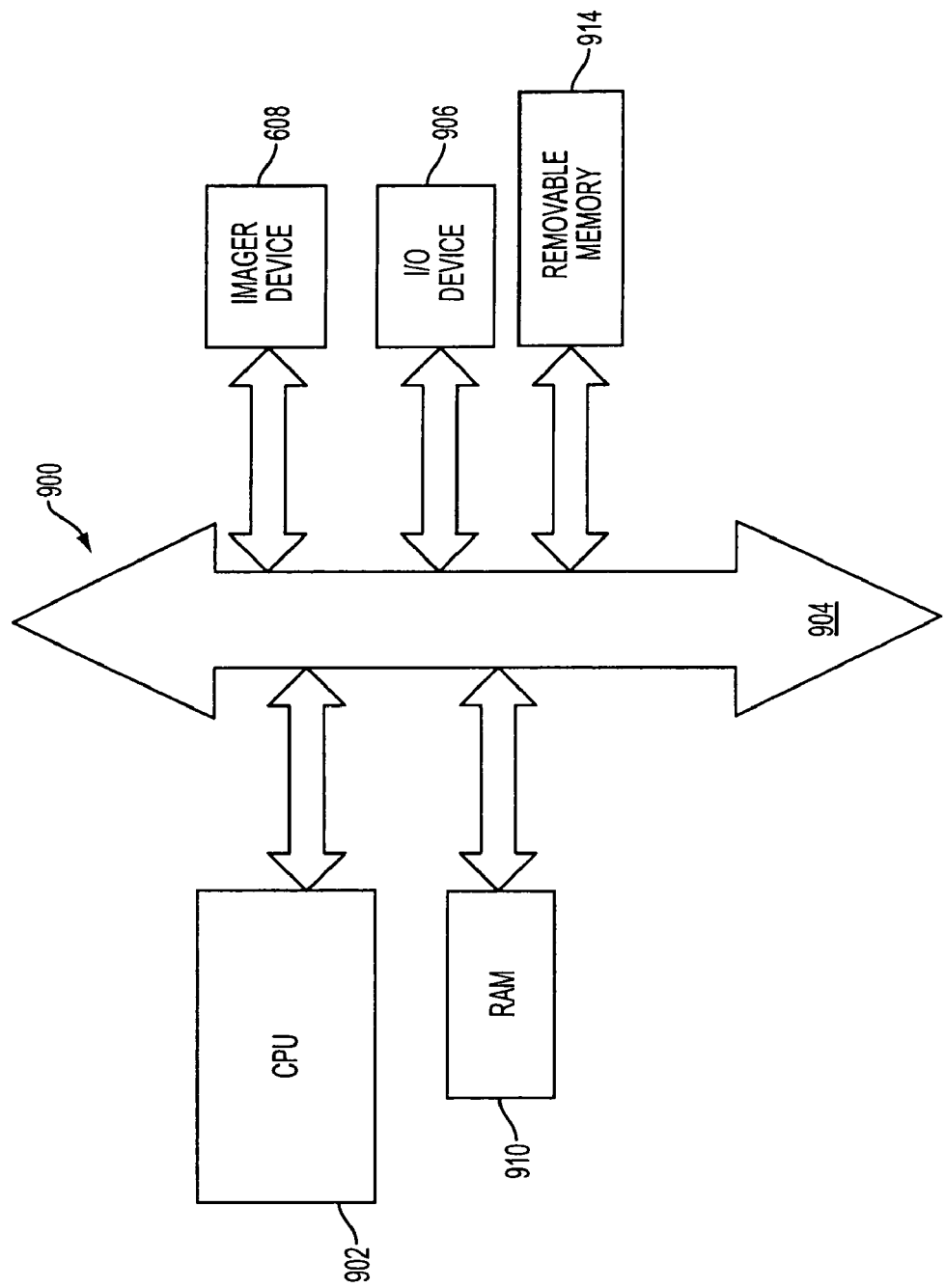
FIG. 8 is a schematic diagram of a processor system incorporating the FIG. 7 imaging device in accordance with an exemplary embodiment of the invention.

FIG. 8 shows a processor system 900, which includes an imaging device (such as the FIG. 7 imaging device 608) of the invention. The processor system 900 is exemplary of a system having digital circuits that could include image sensor devices. Without being limiting, such a system could include a computer system, camera system, scanner, machine vision, vehicle navigation, video phone, surveillance system, auto focus system, star tracker system, motion detection system, image stabilization system, and other systems employing an imager.

System 900, for example a camera system, generally comprises a central processing unit (CPU) 902, such as a microprocessor, that communicates with an input/output (I/O) device 906 over a bus 904. CMOS imager device 608 also communicates with the CPU 902 over the bus 904. The processor-based system 900 also includes random access memory (RAM) 910, and can include removable memory 914, such as flash memory, which also communicate with the CPU 902 over the bus 904. The imaging device 608 may be combined with a processor, such as a CPU, digital signal processor, or microprocessor, with or without memory storage on a single integrated circuit or on a different chip than the processor.

It should again be noted that although the invention has been described with specific references to CMOS imaging devices, the invention has broader applicability and may be used in any imaging apparatus. For example, the invention may be used in conjunction with charge coupled device (CCD) imagers. The above description and drawings illustrate preferred embodiments which achieve the objects, features, and advantages of the invention. Although certain advantages and preferred embodiments have been described above, those skilled in the art will recognize that substitutions, additions, deletions, modifications and/or other changes may be made without departing from the spirit or scope of the invention. Accordingly, the invention is not limited by the foregoing description but is only limited by the scope of the appended claims.

The invention claimed is:

1. A method of forming an integrated circuit, comprising:
    forming an epitaxial layer having a first conductivity over a substrate;
    forming at least first and second photosensors within said epitaxial layer, each photosensor formed to have a first doped region of said first conductivity type formed over and in direct physical contact with a second doped region of a second conductivity type and wherein
    said second doped region of one of said first and second photosensors has a different dopant concentration than said second doped region of the other of said first and second photosensors.

2. The method of claim 1, further comprising forming a resist layer over portions of said epitaxial layer, doping exposed portions of said epitaxial layer, forming a second resist layer over some previously exposed portions of said epitaxial layer, and further doping exposed portions of said epitaxial layer.

3. The method of claim 1, further comprising forming said second doped regions of said first and second photosensors such that said second doped regions have a depth from a surface of said epitaxial layer that are different from each other.

4. The method of claim 1, wherein:
    the second doped region of said first photosensor is formed with a dopant concentration in the range from about $1\times10^{12}/cm^3$ to about $1\times10^{13}/cm^3$; and
    said second doped region of said second photosensor is formed with a dopant concentration in the range from about $5\times10^{11}/cm^3$ to about $6\times10^{12}/cm^3$.

5. The method of claim 1, wherein:
    the second doped region of said first photosensor is formed with a dopant concentration in the range from about $2\times10^{12}/cm^3$ to about $5\times10^{12}/cm^3$; and
    said second doped region of said second photo sensor is formed with a dopant concentration in the range from about $1\times10^{12}/cm^3$ to about $4\times10^{12}/cm^3$.

6. A method of forming an integrated circuit, comprising:
forming an epitaxial layer having first and second surfaces, said first surface facing a substrate;
forming at least first and second photosensors within said second surface of said epitaxial layer, each photosensor formed to have a first doped region of said first conductivity type formed over a second doped region of a second conductivity type, and
wherein:
a bottommost portion of said first doped region of one of said first and second photosensors has a different depth as measured from said second surface of said epitaxial layer than a bottommost portion of said first doped region of the other of said first and second photosensors; and
said second doped region of one of said first and second photosensors has a different concentration than said second doped region of the other of said first and second photo sensors.

7. The method of claim 6, wherein said first doped region of said first photosensor is formed by implanting dopant ions into said epitaxial layer at an energy level in the range from about 5 KeV to about 750 KeV.

8. The method of claim 7, wherein said first doped region of said first photosensor is formed by implanting dopant ions into said epitaxial layer at an energy level in the range from about 30 KeV to about 150 KeV.

9. The method of claim 6, further comprising forming a resist layer over portions of said epitaxial layer, doping exposed portions of said epitaxial layer, forming a second resist layer over some previously exposed portions of said epitaxial layer, and further doping exposed portions of said epitaxial layer.

10. The method of claim 6, wherein said second doped region of one of said first and second photosensors has a third depth within said epitaxial layer that is different than a fourth depth of said second doped region of the other of said first and second photosensors within said epitaxial layer.

11. The method of claim 10, wherein said third depth is within a range of 0.9 µm to 1.2 µm from said surface of said epitaxial layer, and said fourth depth is within a range of 0.15 µm to 0.6 µm from said surface of said epitaxial layer.

12. The method of claim 6, wherein said second doped region of said first and second photosensors have different depths within said epitaxial layer.

13. The method of claim 6, wherein said first depth is within a range of 0.4 µm to 0.7 µm from a surface of said epitaxial layer, and said second depth is within a range of 0.05 µm to 0.15 µm from said surface of said epitaxial layer.

* * * * *